United States Patent
Park et al.

(10) Patent No.: US 11,686,943 B2
(45) Date of Patent: Jun. 27, 2023

(54) DISPLAY DEVICE

(71) Applicant: Samsung Display Co., Ltd., Yongin-si (KR)

(72) Inventors: JeongWoo Park, Yongin-si (KR); Jaejoong Kwon, Suwon-si (KR); Hyun Sup Lee, Seoul (KR); Subin Jung, Incheon (KR); Juhwa Ha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/809,424

(22) Filed: Mar. 4, 2020

(65) Prior Publication Data
US 2020/0285057 A1 Sep. 10, 2020

(30) Foreign Application Priority Data
Mar. 5, 2019 (KR) .................. 10-2019-0025424

(51) Int. Cl.
*H10K 59/12* (2023.01)
*G02B 27/01* (2006.01)
*H10K 77/10* (2023.01)

(52) U.S. Cl.
CPC ......... *G02B 27/0172* (2013.01); *H10K 59/12* (2023.02); *H10K 77/111* (2023.02); *G02B 2027/0178* (2013.01)

(58) Field of Classification Search
CPC ............. G02B 27/0172; G02B 3/0037; G02B 2027/0178; G02B 27/143; G02B 5/001; G02B 2027/0123; G02B 3/0056; G02B 2027/0125; G02B 27/0075; G02B 27/017; H01L 27/3244; H01L 51/0097; Y02E 10/549
See application file for complete search history.

(56) References Cited

U.S. PATENT DOCUMENTS

| | | | |
|---|---|---|---|
| 8,503,087 B1 * | 8/2013 | Amirparviz | G02B 27/0172 359/850 |
| 8,537,075 B2 | 9/2013 | Crocco et al. | |
| 9,761,051 B2 | 9/2017 | Bromer | |
| 10,203,501 B2 | 2/2019 | Komori et al. | |
| 2004/0264162 A1 * | 12/2004 | Kashiwagi | G02B 6/0018 362/600 |
| 2010/0149073 A1 | 6/2010 | Chaum et al. | |
| 2017/0108697 A1 | 4/2017 | El-Ghoroury et al. | |
| 2018/0292652 A1 * | 10/2018 | Ha | G02B 27/0179 |

(Continued)

FOREIGN PATENT DOCUMENTS

| | | |
|---|---|---|
| JP | 5402293 B2 | 1/2014 |
| KR | 10-1660519 B1 | 9/2016 |

(Continued)

*Primary Examiner* — Temesghen Ghebretinsae
*Assistant Examiner* — Karin Kiyabu
(74) *Attorney, Agent, or Firm* — Lewis Roca Rothgerber Christie LLP

(57) ABSTRACT

A display device comprising: a lens module comprising a lens and a reflective module in the lens; and a display module on at least one side surface of the lens, the display module being configured to display an image, the lens comprising: a side surface facing the display module and configured to receive the image; and an exiting surface configured to emit the image reflected by the reflective module, wherein the side surface comprises one or more inclination surfaces.

16 Claims, 15 Drawing Sheets

(56) References Cited

U.S. PATENT DOCUMENTS

| | | | |
|---|---|---|---|
| 2019/0025589 A1* | 1/2019 | Haddick | G02B 27/0018 |
| 2019/0086668 A1 | 3/2019 | Ha | |
| 2019/0107662 A1* | 4/2019 | Ellison | G02B 6/0068 |
| 2019/0204600 A1* | 7/2019 | Ha | G02B 27/017 |
| 2020/0278483 A1* | 9/2020 | Amma | G02B 27/0172 |
| 2020/0386995 A1* | 12/2020 | Ha | G02B 27/0172 |

FOREIGN PATENT DOCUMENTS

| | | |
|---|---|---|
| KR | 10-1830364 B1 | 2/2018 |
| KR | 10-2018-0070626 A | 6/2018 |

* cited by examiner

DISPLAY DEVICE

CROSS-REFERENCE TO RELATED APPLICATION

The present application claims priority to and the benefit of Korean Patent Application No. 10-2019-0025424, filed on Mar. 5, 2019, the content of which is hereby incorporated by reference in its entirety.

BACKGROUND

1. Field

Aspects of some example embodiments of the present disclosure relate to a display device providing augmented reality images.

2. Description of the Related Art

Augmented reality refers to a technology of superimposing a virtual image on a user's view of a real world image or real world environment and displaying the superimposed images as a single image. The virtual image may be an image in the form of text or graphics, and the real image may be associated with information on real objects observed in the field of view of the device.

The augmented reality may be implemented by a head mounted display (HMD) or a head-up display (HUD). When the augmented reality is implemented by the HMD, the HMD may be provided, for example, in the form of a pair of eyeglasses so that a user easily wears it or takes it off as well as carries it.

An augmented reality providing device includes a display device to provide the virtual image used to implement the augmented reality. In recent years, there has been a demand to enlarge an area of the display device, which is viewed by the user, that is, a field of view (FOV) of the user.

The above information disclosed in this Background section is only for enhancement of understanding of the background and therefore the information discussed in this Background section does not necessarily constitute prior art.

SUMMARY

Aspects of some example embodiments of the present disclosure include a display device having a relatively reduced thickness and a relatively expanded field of view (FOV).

According to some example embodiments of the inventive concept, a display device includes: a lens module including a lens and a reflective module located in the lens and a display module located on at least one side surface of the lens and displaying an image. The lens includes a side surface facing the display module and receiving the image and an exiting surface emitting the image reflected by the reflective module. The side surface includes one or more inclination surfaces.

According to some example embodiments of the inventive concept, a display device includes: a lens module including a lens and a reflective module located in the lens and a display module located on at least one side surface of the lens and displaying an image. The lens includes a side surface facing the display module and receiving the image and an exiting surface emitting the image reflected by the reflective module. The side surface includes at least one curved surface.

According to some example embodiments, the display device may allow the side surface of the lens, on which the display module is located, to have the one or more inclination surfaces or the curved shape. Thus, the display module having a width greater than a width of the lens may be located on an incident surface. As a result, the FOV of the display device may be widened without increasing the thickness of the display device.

BRIEF DESCRIPTION OF THE DRAWINGS

The above and other aspects of the present disclosure will become more readily apparent by reference to the following detailed description when considered in conjunction with the accompanying drawings wherein.

DETAILED DESCRIPTION

Figure 1:
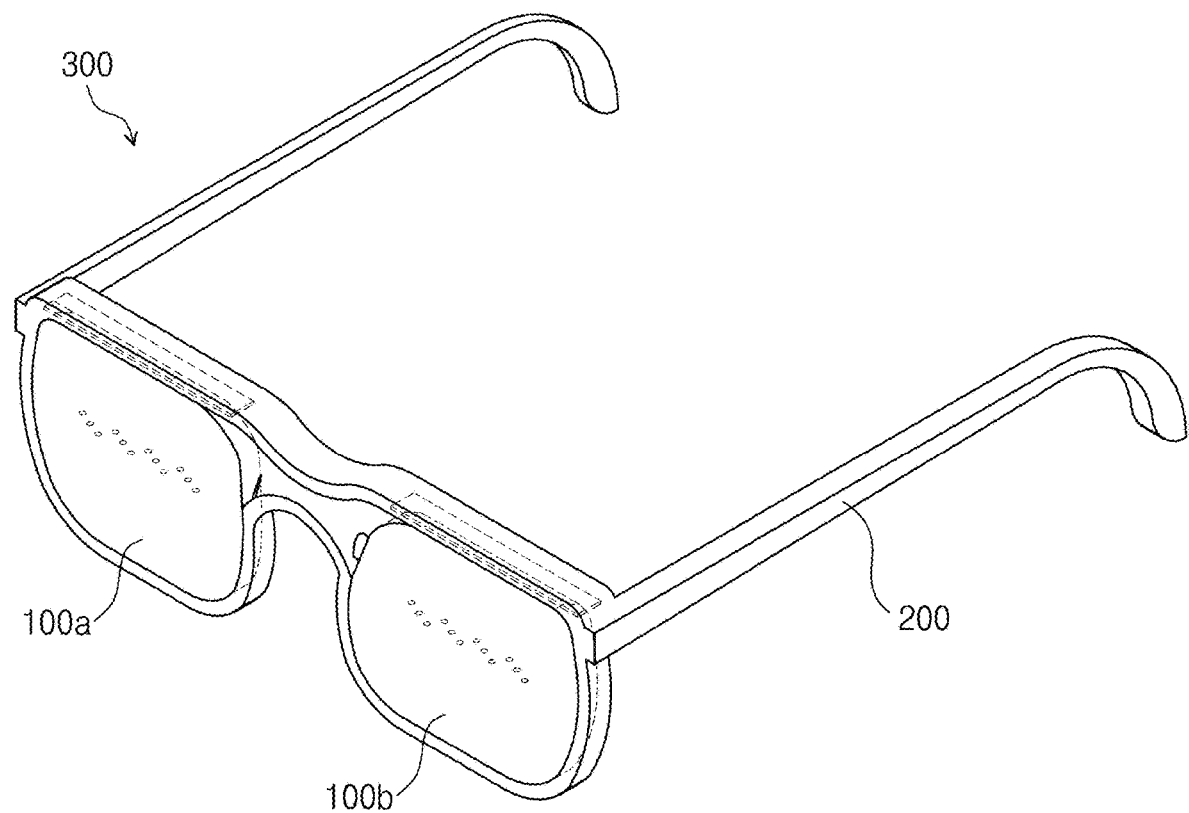
FIG. 1 is a perspective view showing an electronic device including an augmented reality providing device according to some example embodiments of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

FIG. 1 is a perspective view showing an electronic device 300 including an augmented reality providing device according to some example embodiments of the present disclosure.

Referring to FIG. 1, the electronic device 300 providing a user with an augmented reality image may have a shape, which is mounted on a user's head. For example, the electronic device 300 may be an eyeglasses-type device. The electronic device 300 may include a first display device 100a, a second display device 100b, and a frame 200 coupling the first display device 100a and the second display device 100b.

The first display device 100a may include a first augmented reality providing device providing the augmented reality image to a right eye of the user, and the second display device 100b may include a second augmented reality providing device providing the augmented reality image to a left eye of the user. The first and second augmented reality providing devices 100a and 100b may have substantially the same shape as each other.

The frame 200 is coupled to each of the first and second augmented reality providing devices 100a and 100b and protects the first and second augmented reality providing devices 100a and 100b. The frame 200 may have a shape that is worn by the user. FIG. 1 shows the eyeglasses-type electronic device 300, however, the electronic device 300 should not be limited to the eyeglasses-type. That is, the electronic device 300 may be implemented in various forms that may be worn by the user, such as a band type.

The first and second augmented reality providing devices 100a and 100b have substantially the same shape as each other and operate with the same driving principle. Hereinafter, the augmented reality providing device described with reference to figures may be applied to both of the first and second augmented reality providing devices 100a and 100b.

Figure 2:
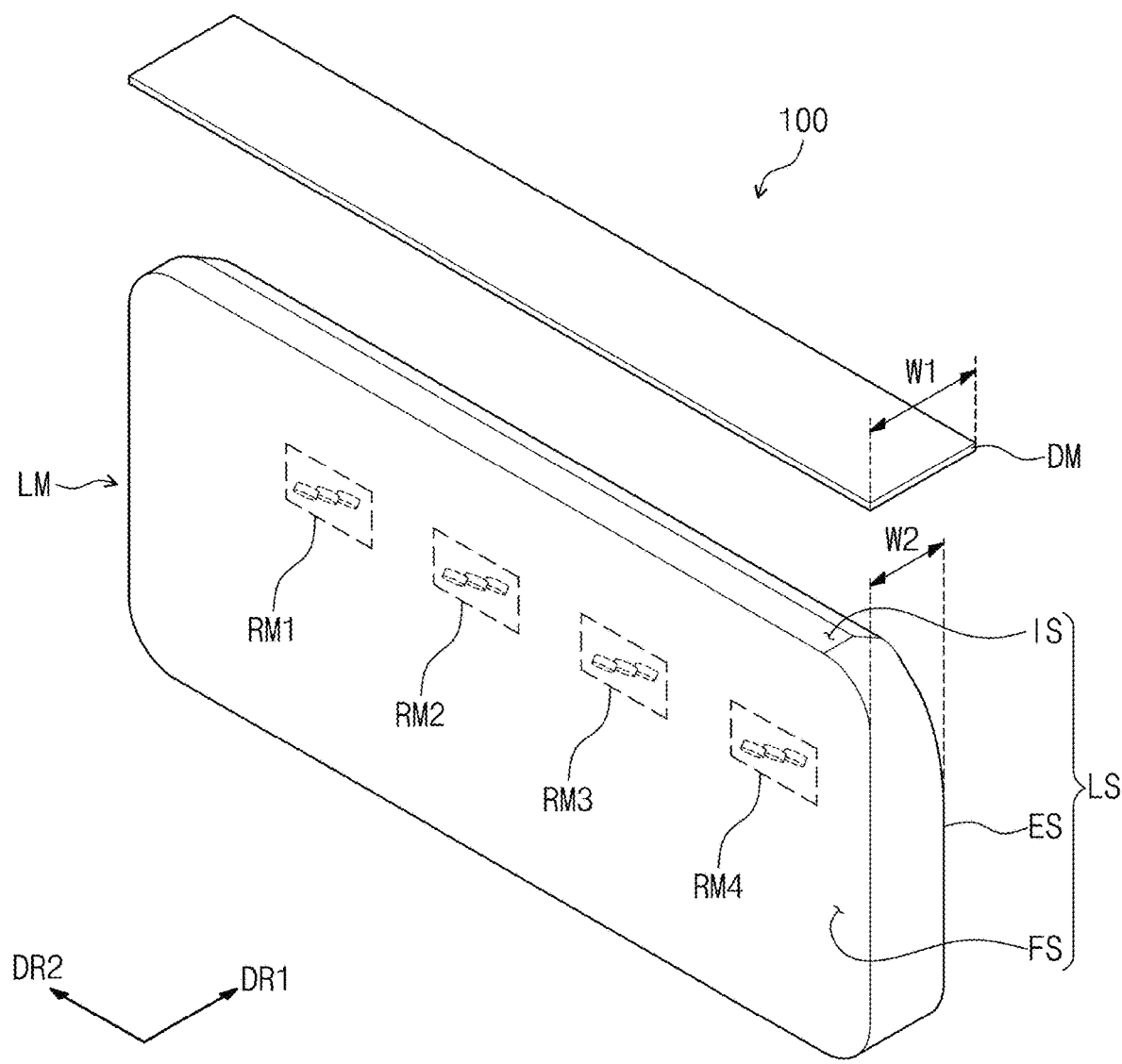
FIG. 2 is an exploded perspective view showing an augmented reality providing device according to some example embodiments of the present disclosure.

FIG. 2 is an exploded perspective view showing an augmented reality providing device 100 according to some example embodiments of the present disclosure.

Referring to FIG. 2, the augmented reality providing device 100 according to some example embodiments of the present disclosure includes a lens module LM and a display module DM.

The lens module LM includes a lens LS and reflective modules RM1 to RM4. The lens LS may be formed to be transparent or semi-transparent using a glass or plastic material. Accordingly, the user may see a real image through the lens LS. The lens LS may have a refractive power (e.g., a predetermined refractive power) according to a user's eyesight.

The lens LS may have a decahedral shape defined by two bottom surfaces ES and FS and side surfaces connecting the two bottom surfaces ES and FS. However, the shape of the lens LS should not be limited thereto or thereby, and the lens LS may have various shapes. For example, the lens LS may have a polyhedral shape defined by two bottom surfaces, each having a polygonal shape, and side surfaces connecting the two bottom surfaces. In addition, the lens LS may have various shapes, such as a cylindrical shape, an elliptical shape, a semi-cylindrical shape, and a semi-elliptical shape rather than the polyhedral shape.

At least one side surface among the side surfaces of the lens LS may have a multi-sided structure. The at least one side surface having the multi-sided structure may be located adjacent to the display module DM and may receive an image from the display module DM. Accordingly, hereinafter, the side surface will be referred to an "incident surface IS". That is, the incident surface IS may have the multi-sided structure. The incident surface IS may include a plurality of surfaces arranged in a first direction DR1. The incident surface IS may extend in a second direction DR2 perpendicular to the first direction DR1.

The lens module LM includes the reflective modules RM1 to RM4. The reflective modules RM1 to RM4 may be arranged in the second direction DR2 along the incident surface IS. In FIG. 2, the lens module LM includes first to fourth reflective modules RM1 to RM4, however, the number of the reflective modules RM1 to RM4 should not be limited thereto or thereby. Each of the reflective modules RM1 to RM4 includes a plurality of reflective mirrors RIM1 to RIM3 (refer to FIG. 3). The reflective mirrors RIM1 to RIM3 are arranged in the first direction DR1. As a representative example of the present disclosure, each of the reflective modules RM1 to RM4 includes first to third reflective mirrors RIM1 to RIM3, however, the number of the reflective mirrors RIM1 to RIM3 should not be limited thereto or thereby.

The reflective mirrors RIM1 to RIM3 reflect a virtual image displayed through the display module DM to be focused on a retina of the user's eye HE. Accordingly, although the user focuses on the real image through the lens LM, the user may clearly see the virtual image. That is, the user may clearly see the virtual image even though the user does not shift the focus on the real image.

Each of the reflective mirrors RIM1 to RIM3 may have a size smaller than a size of a pupil. As an example, each of the reflective mirrors RIM1 to RIM3 may have a diameter of about 4 mm or less. In this case, because the user focuses on the real image, it is difficult for the user to recognize the reflective mirrors RIM1 to RIM3. However, as the size of each of the reflective mirrors RIM1 to RIM3 decreases, a brightness of the virtual image provided to the user's eye HE by the display module DM may be reduced. Therefore, the size of the reflective mirrors RIM1 to RIM3 may be set by taking into account the above-mentioned aspects.

When the size of the reflective mirrors RIM1 to RIM3 is smaller than the size of the pupil, the reflective mirrors RIM1 to RIM3 have a pinhole effect. Therefore, each of the first to third reflective mirrors RIM1 to RIM3 may be referred to as a "pin mirror". When the virtual image displayed through the display module DM is reflected by the reflective mirrors RIM1 to RIM3, a depth of field becomes deep.

Figure 3:
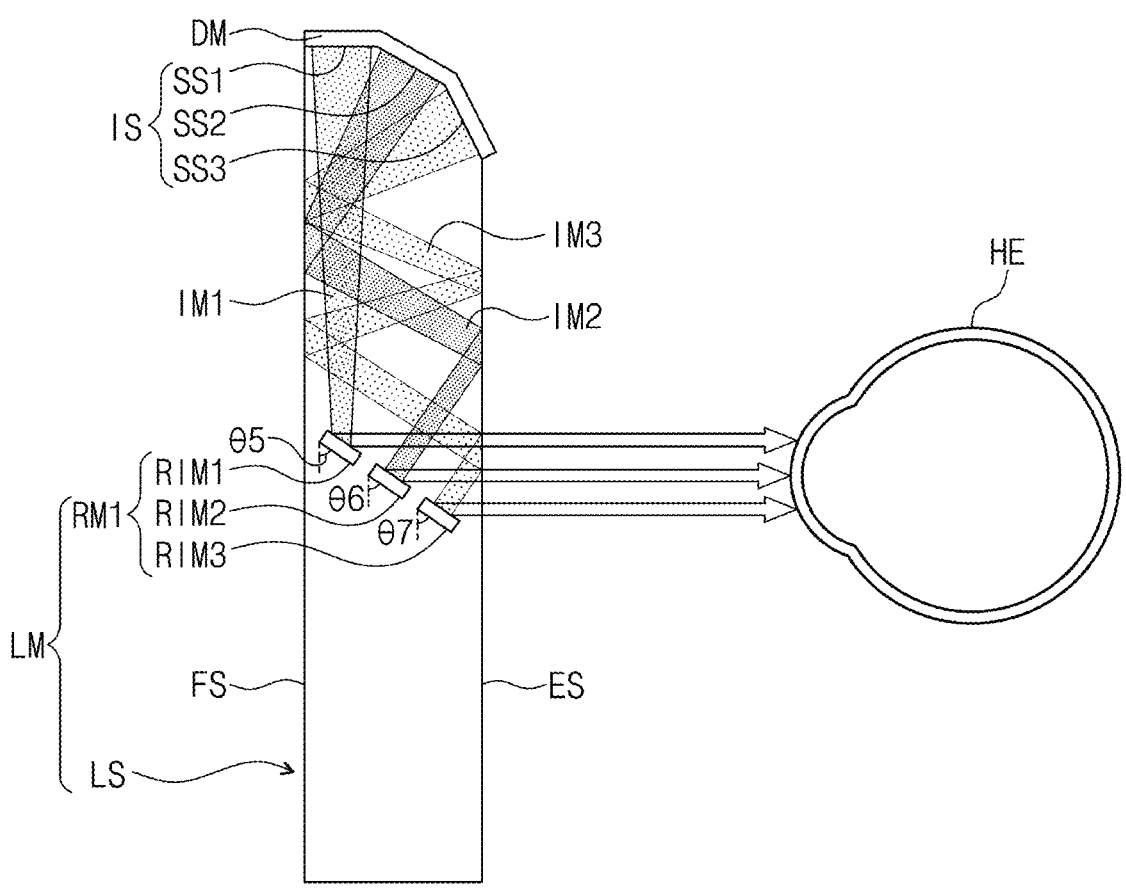
FIG. 3 is a cross-sectional view showing an operation of the augmented reality providing device shown in FIG. 2.

As an example, the first to third reflective mirrors RIM1 to RIM3 may include a metal material having a high reflectance, such as silver (Ag). In FIG. 3, each of the reflective mirrors RIM1 to RIM3 has a circular plate shape, however, each of the reflective mirrors RIM1 to RIM3 may have an oval or polygonal plate shape rather than the circular plate shape. In addition, according to some example embodiments, each of the reflective mirrors RIM1 to RIM3 may have a curved shape.

The number of the reflective modules RM1 to RM4 included in the lens module LM and the number of the reflective mirrors RIM1 to RIM3 included in each of the reflective modules RM1 to RM4 may increase to widen an area of the display module DM viewed to the user's eye HE, that is, a field of view (FOV) of the user.

The display module DM displays the virtual image to implement the augmented reality. The display module DM may be located adjacent to the incident surface IS of the lens LM, and the image displayed through the display module DM may be provided to the lens module LM through the incident surface IS.

The display module DM may have a flexibility, and thus may be bent. As an example, the display module DM may be a flexible organic light emitting display.

In FIG. 2, the display module DM is located on the one side surface among the side surfaces of the lens LS, however, the present disclosure should not be limited thereto or thereby. That is, the display module DM may be located on two or more side surfaces of the lens LS. In this case, the display module DM may include a plurality of display parts that display the image.

A functional module may be further located between the display module DM and the incident surface IS of the lens LS. For example, the functional module may include at least one layer with a light condensing function, an anti-reflection function, and an adhesive function.

Figure 4A:
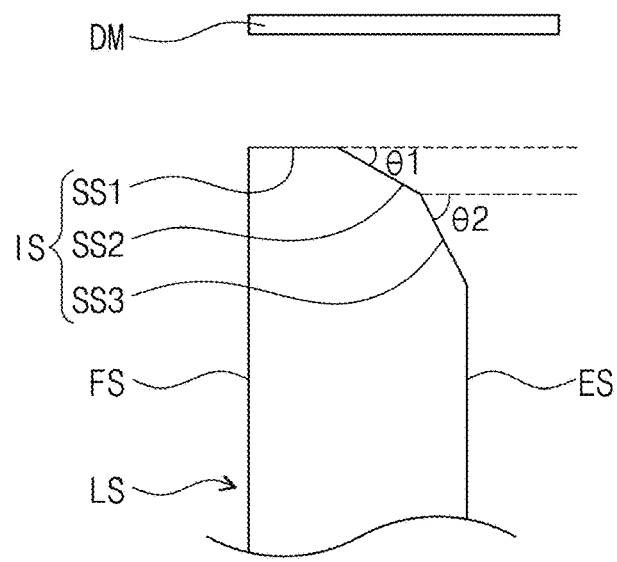
FIG. 4A is a view showing a state before coupling of a display module to a lens module of FIG. 3.
Figure 4B:
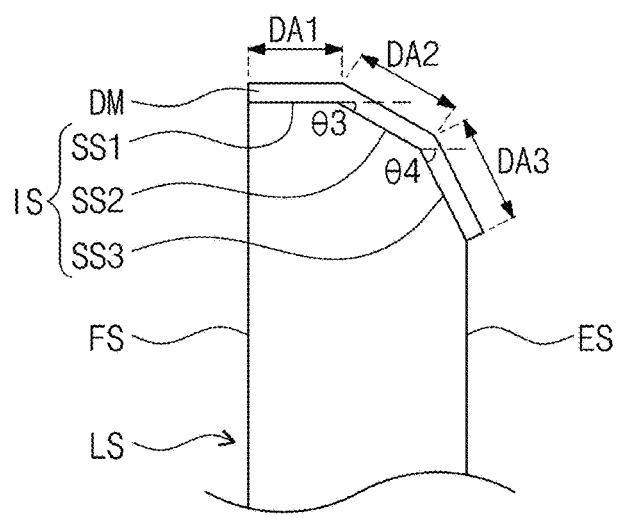
FIG. 4B is a view showing a state in which the display module is coupled to a lens module of FIG. 4A.

FIG. 3 is a cross-sectional view showing an operation of the augmented reality providing device shown in FIG. 2, FIG. 4A is a view showing a state before coupling of the display module to a lens module shown in FIG. 3, and FIG. 4B is a view showing a state in which the display module is coupled to the lens module of FIG. 4A.

Referring to FIG. 3, the lens LS may include an exiting surface ES that emits an image reflected by the reflective mirrors RIM1 to RIM3 and a facing surface FS facing the exiting surface ES. The exiting surface ES and the facing surface FS may be connected to each other by the side surfaces. The display module DM is located adjacent to one side surface among the side surfaces of the lens LS. The one side surface is defined as the incident surface IS into which the virtual image displayed through the display module DM is incident. That is, the image output from the display module DM is provided to the lens module LM through the incident surface IS.

The incident surface IS includes at least one inclination surface. As an example, the incident surface IS includes a reference surface SS1, a first inclination surface SS2, and a second inclination surface SS3.

The reference surface SS1 may be substantially vertical to the exiting surface ES and the facing surface FS. One side portion of the reference surface SS1 may be connected to the facing surface FS. The first inclination surface SS2 may be inclined with respect to the reference surface SS1, and one side portion thereof may be connected to the reference surface SS1. The second inclination surface SS3 may be inclined with respect to the reference surface SS1, one side portion thereof may be connected to the first inclination surface SS2, and the other side portion thereof may be connected to the exiting surface ES. The first and second inclination surfaces SS2 and SS3 may be located between the exiting surface ES and the reference surface SS1.

FIGS. 3 to 4B show the structure in which two inclination surfaces SS2 and SS3 are located between the exiting surface ES and the reference surface SS1 as a representative example, however, they should not be limited thereto or thereby. That is, one inclination surface or three or more inclination surfaces may be located between the exiting surface ES and the reference surface SS1.

The first inclination surface SS2 is inclined at a first angle $\theta 1$ toward the reference surface SS1, and the second inclination surface SS3 is inclined at a second angle $\theta 2$ toward the reference surface SS1. The first angle $\theta 1$ and the second angle $\theta 2$ may be different from each other. As an example, the second angle $\theta 2$ may be greater than the first angle $\theta 1$.

As shown in FIGS. 2 and 4A, the display module DM is located adjacent to the incident surface IS. A width W1 in the first direction DR1 of the display module DM may be greater than a width W2 in the first direction DR1 of the lens LS. That is, when the display module DM is unfolded in the first direction DR1 before the display module DM is coupled to the lens LS, the width W1 of the display module DM is greater than the width W2 of the lens LS.

As shown in FIGS. 3 and 4B, when the display module DM is coupled to the lens LS, the display module DM may be located to correspond to the reference surface SS1 and the first and second inclination surfaces SS2 and SS3. That is, the display module DM may be bent along the reference surface SS1 and the first and second inclination surfaces SS2 and SS3.

As an example, the display module DM includes a first display area DA1, a second display area DA2, and a third display area DA3. The first display area DA1 is located to correspond to the reference surface SS1 of the incident surface IS. The second display area DA2 is bent at a third angle $\theta 3$ from the first display area DA1 and located to correspond to the first inclination surface SS2 of the incident surface IS. The third display area DA3 is bent at a fourth angle $\theta 4$ from the second display area DA2 and located to correspond to the second inclination surface SS3 of the incident surface IS. In the present example embodiment, the third angle $\theta 3$ may be substantially the same as the first angle $\theta 1$, and the fourth angle $\theta 4$ may be substantially the same as the second angle $\theta 2$.

As described above, because the display module DM is coupled to the lens module LM in a bent shape along the incident surface IS having the multi-sided structure, the entire of the image displayed through the display module DM may be provided to the user's eye HE without the need to increase the width, i.e., a thickness, of the lens LS even though the display module DM having the width larger than the width of the lens LS is employed. Accordingly, the field of view (FOV) of the user may be widened while preventing the thickness of the augmented reality providing device 100 from increasing.

Referring to FIG. 3 again, the first reflective module RM1 includes the first to third reflective mirrors RIM1 to RIM3. The first to third reflective mirrors RIM1 to RIM3 are located to be spaced apart from each other. The first reflective mirror RIM1 reflects a first image IM1 incident through the reference surface SS1 to the exiting surface ES. The second reflective mirror RIM2 reflects a second image IM2 incident through the first inclination surface SS2 to the exiting surface ES. The third reflective mirror RIM3 reflects a third image IM3 incident through the second inclination surface SS3 to the exiting surface ES.

The first reflective mirror RIM1 may be located to be inclined at a fifth angle θ5 with respect to the facing surface FS, and the second reflective mirror RIM2 may be located to be inclined at a sixth angle θ6 with respect to the facing surface FS. The third reflective mirror RIM3 may be located to be inclined at a seventh angle θ7 with respect to the facing surface FS. In this case, the fifth to seventh angles θ5 to θ7 may have different values from each other.

The first image IM1 exiting from the first display area DA1 is directly and mostly provided to the first reflective mirror RIM1 after passing through the reference surface SS1. That is, most of the first image IM1 is directly provided to the first reflective mirror RIM1 without being refracted by the facing surface FS and the exiting surface ES. The fifth angle θ5 may be set to allow the first image IM1 incident into the first reflective mirror RIM1 to be incident into the user's eye HE at maximum. As an example, the fifth angle θ5 may be about 45°.

Meanwhile, most of the second image IM2 exiting from the second display area DA2 is provided to the second reflective mirror RIM2 after being totally reflected by the facing surface FS and the exiting surface ES. The sixth angle θ6 may be set to allow the second image IM2 internally reflected by the lens LS to be provided to the user's eye HE by the second reflective mirror RIM2 at maximum. The sixth angle θ6 may be changed depending on the first angle θ1 of the first inclination surface SS2 and a refractive index of the lens LS.

Most of the third image IM3 exiting from the third display area DA3 is provided to the third reflective mirror RIM3 after being totally reflected by the facing surface FS and the exiting surface ES. The seventh angle θ7 may be set to allow the third image IM3 internally reflected by the lens LS to be provided to the user's eye HE by the third reflective mirror RIM3 at maximum. The seventh angle θ7 may be changed depending on the second angle θ2 of the second inclination surface SS3 and the refractive index of the lens LS.

As described above, the fifth to seventh angles θ5 to θ7 may be set to provide the images IM1 to IM3 provided from corresponding display areas DA1 to DA3 to the user's eye HE. In addition, distances between the reflective mirrors RIM1 to RIM3 may be changed. That is, the reflective mirrors RIM1 to RIM3 are spaced at regular intervals in FIG. 3, however, they should not be limited thereto or thereby. The distances between the reflective mirrors RIM1 to RIM3 may be set to provide the images IM1 to IM3 provided from the corresponding display areas DA1 to DA3 to the user's eye HE.

Each of the reflective mirrors RIM1 to RIM3 allows the first to third images IM1 to IM3, which are virtual images and displayed through the corresponding display areas DA1 to DA3 of the display module DM, to be focused at one point on the retina of the user's eye HE. Accordingly, even though the user focuses on the real image through the lens LS, the user may see the virtual image clearly. That is, although the user does not shift the focus on the real image, the user may see the virtual image clearly.

As described above, the structure in which the incident surface IS includes at least one inclination surface SS2 and SS3 has been described. One side portion of a lens body having a tetrahedral shape may be processed so as to form the lens LS provided with the at least one inclination surface SS2 and SS3 on the incident surface IS. As a method of processing the shape of the lens body, a wheel processing method, a laser processing method, an edge separation method by induction heating, or the like may be used. The at least one inclination surface SS2 and SS3 may be provided on the incident surface IS by the above-mentioned shape processing method. According to some example embodiments of the present disclosure, the at least one inclination surface SS2 and SS3 formed by the above-mentioned method may have a surface roughness equal to or smaller than about 10 nm.

Figure 5A:
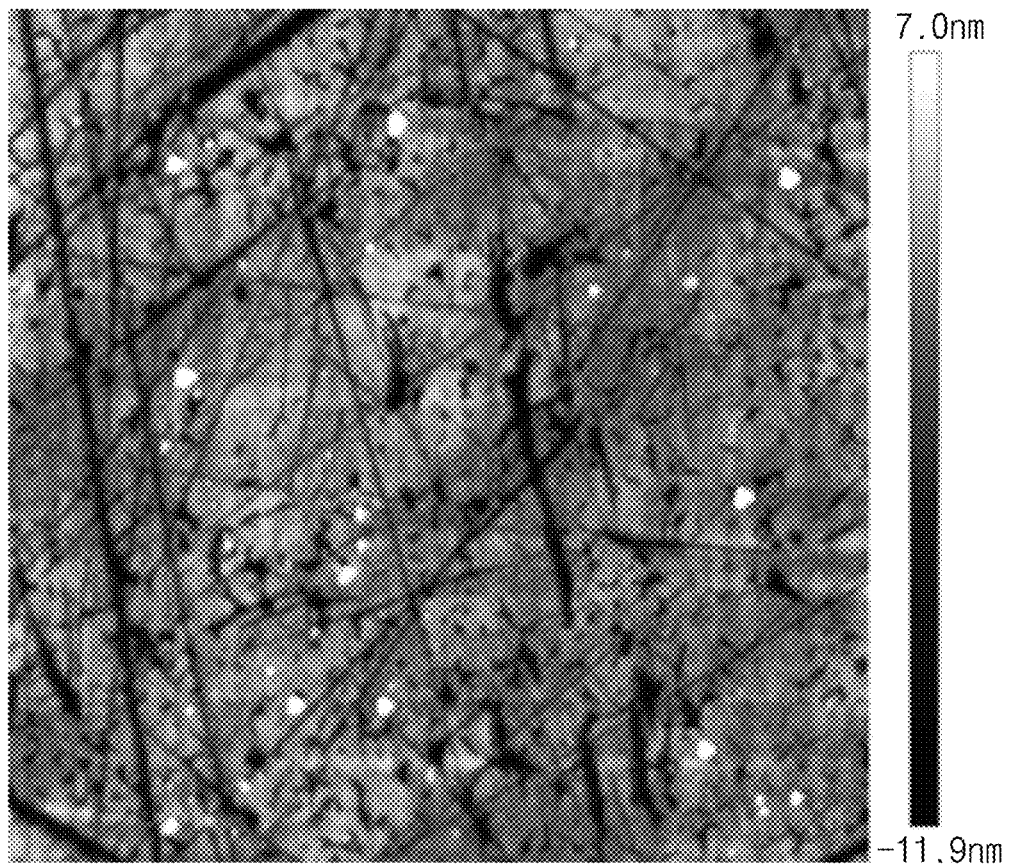
FIG. 5A is a view showing a first inclination surface shown in FIG. 4A.
Figure 5B:
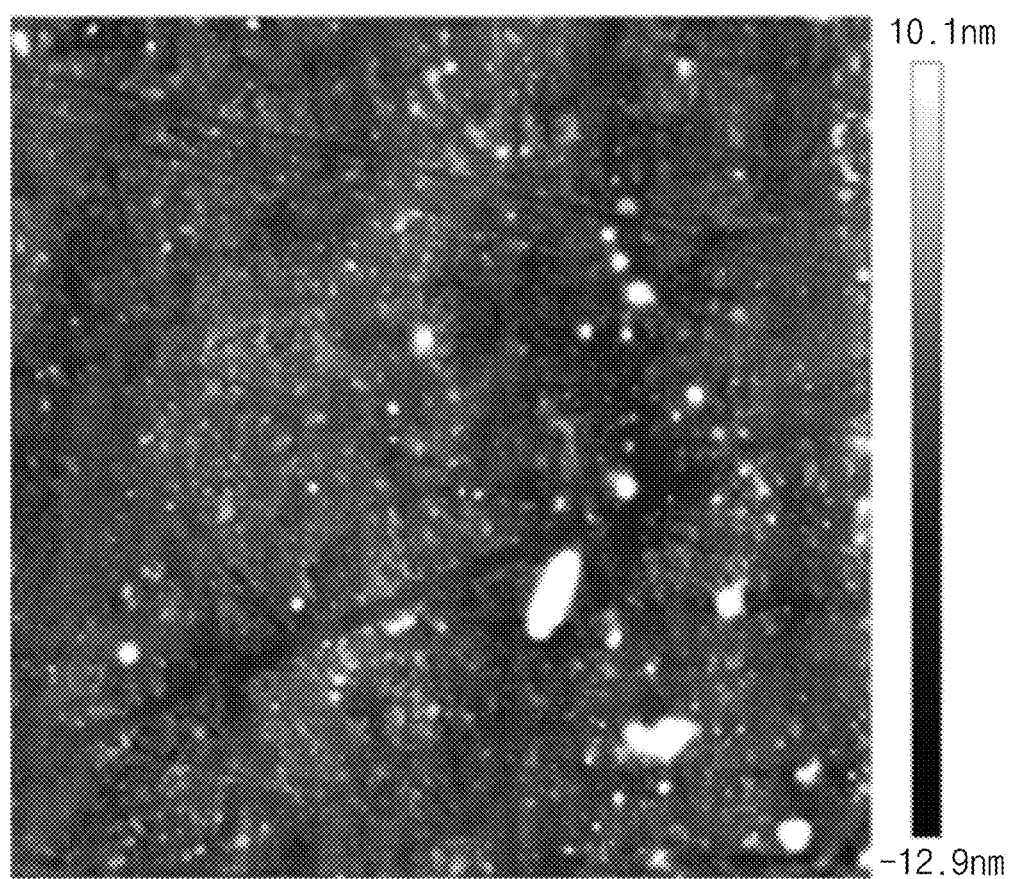
FIG. 5B is a view showing a second inclination surface shown in FIG. 4A.

FIG. 5A is a view showing the first inclination surface shown in FIG. 4A, and FIG. 5B is a view showing the second inclination surface shown in FIG. 4A.

The reference surface SS1, which is not subjected to a shape processing treatment, may have the surface roughness of about 0.2 nm to 0.5 nm. As shown in FIGS. 5A and 5B, the first and second inclination surfaces SS2 and SS3 formed through the shape fabrication process may have the surface roughness higher than that of the reference surface SS1. However, the surface roughness of the reference surface SS1 and the first and second inclination surfaces SS2 and SS3 may be equal to or smaller than about 10 nm. As an example, the first and second inclination surfaces SS2 and SS3 may have the surface roughness of about 0.2 nm to 2 nm.

In addition, a fabricating process may be added to improve a surface roughness quality of the first and second inclination surfaces SS2 and SS3. That is, a secondary fabrication process is performed on the first and second inclination surfaces SS2 and SS3 after the shape fabrication process, and thus the surface roughness of the first and second inclination surfaces SS2 and SS3 may be improved.

Figure 6A:
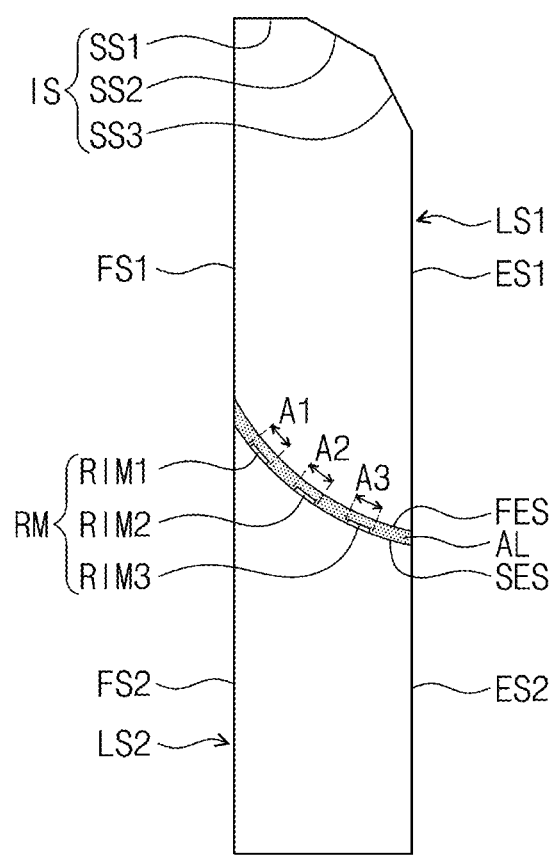
FIG. 6A is a cross-sectional view showing a lens module according to some example embodiments of the present disclosure.
Figure 6B:
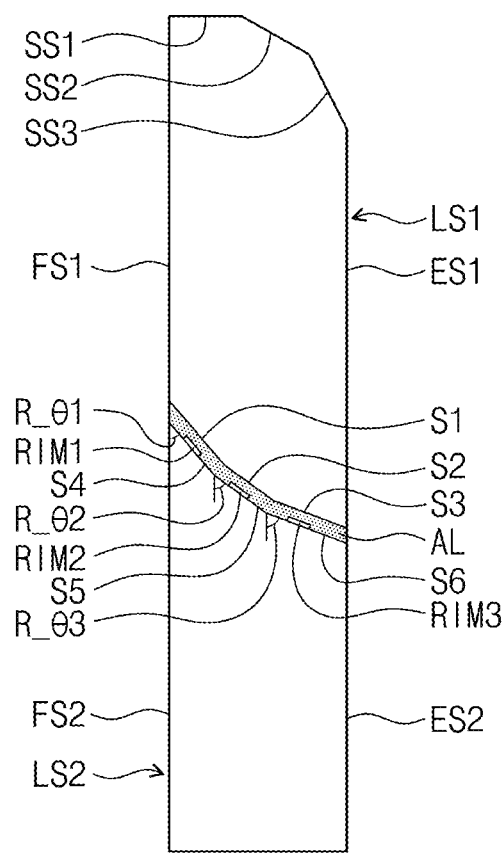
FIG. 6B is a cross-sectional view showing a lens module according to some example embodiments of the present disclosure.

FIG. 6A is a cross-sectional view showing a lens module according to some example embodiments of the present disclosure, and FIG. 6B is a cross-sectional view showing a lens module according to some example embodiments of the present disclosure.

Referring to FIG. 6A, a lens module LM1 may include a first lens LS1, a second lens LS2, and a reflective module RM. The reflective module RM may include a plurality of reflective mirrors RIM1, RIM2, and RIM3 located between the first lens LS1 and the second lens LS2.

The first lens LS1 includes a first facing surface FS1, a first exiting surface ES1, and a plurality of first side surfaces connecting the first facing surface FS1 and the first exiting surface ES1. One surface IS among the first side surfaces has a multi-sided structure. The display module DM (refer to FIG. 3) is located adjacent to the one surface IS having the multi-sided structure. The one surface IS may be an incident surface receiving the image from the display module DM. Among the first side surfaces, an opposite surface FES opposite to the incident surface IS may have a curved structure. The opposite surface FES may be a first coupling surface coupled to the second lens LS2.

The second lens LS2 includes a second facing surface FS2, a second exiting surface ES2, and a plurality of second side surfaces connecting the second facing surface FS2 and the second exiting surface ES2. One surface among the second side surfaces may be a second coupling surface SES coupled to the first lens LS1. The second coupling surface SES may have substantially the same curved structure as the first coupling surface FES.

The reflective mirrors RIM1 to RIM3 may be located between the first coupling surface FES and the second coupling surface SES. That is, the reflective mirrors RIM1 to RIM3 may be formed by providing a reflective material, such as a silver, on a surface of one of the first coupling surface FES and the second coupling surface SES. The reflective mirrors RIM1 to RIM3 may be formed by a depositing, printing, or coating process.

An adhesive layer AL may be further located between first coupling surface FES and the second coupling surface SES to couple the first lens LS1 and the second lens LS2. The adhesive layer AL may be optically clear. The adhesive layer AL may be an adhesive layer manufactured by coating a liquid adhesive material and curing the liquid adhesive material or an adhesive sheet separately manufactured. For example, the adhesive layer AL may be a pressure sensitive adhesive (PSA), an optical clear adhesive (OCA), or an optical clear resin (OCR).

When the first and second lenses LS1 and LS2 are coupled to each other, the first and second facing surfaces FS1 and FS2 are connected to each other to form one facing surface FS, and the first and second exiting surfaces ES1 and ES2 are connected to each other to form one exiting surface ES. The facing surface FS formed by connecting the first and second facing surfaces FS1 and FS2 to each other corresponds to the facing surface FS shown in FIG. 3, and the exiting surface ES formed by connecting the first and second exiting surfaces ES1 and ES2 to each other corresponds to the exiting surface ES shown in FIG. 3.

A curvature of a coupling surface at which the reflective mirrors RIM1 to RIM3 are formed may vary depending on an inclination angle of first and second inclination surfaces SS2 and SS3. In a case where the reflective mirrors RIM1 to RIM3 are formed on the second coupling surface SES, the second coupling surface SES may be divided into a first area A1 in which the first reflective mirror RIM1 is located, a second area A2 in which the second reflective mirror RIM2 is located, and a third area A3 in which the third reflective mirror RIM3 is located. The curvatures of the second coupling surface SES in the first to third areas A1 to A3 may be different from each other, and particularly, the curvatures of the second coupling surface SES in the second and third areas A2 and A3 may vary depending on the inclination angles of the first and second inclination surfaces SS2 and SS3. The first coupling surface FES may have substantially the same shape as the second coupling surface SES.

Referring to FIG. 6B, each of the first coupling surface FES of the first lens LS1 and the second coupling surface SES of the second lens LS2 may have the multi-sided structure. As an example, the first coupling surface FES may include a first sub-coupling surface S1, a second sub-coupling surface S2, and a third sub-coupling surface S3. The second coupling surface SES may include a fourth sub-coupling surface S4, a fifth sub-coupling surface S5, and a sixth sub-coupling surface S6. Angles between each of the first sub-coupling surface S1, the second sub-coupling surface S2, and the third sub-coupling surface S3 and the first facing surface FS1 may be different from each other. Similarly, angles between each of the fourth sub-coupling surface S4, the fifth sub-coupling surface S5, and the sixth sub-coupling surface S6 and the second facing surface FS2 may be different from each other.

The reflective mirrors RIM1 to RIM3 may be located between the first coupling surface FES and the second coupling surface SES. That is, the reflective mirrors RIM1 to RIM3 may be formed by providing a reflective material, such as a silver, on a surface of one of the first and the second coupling surfaces FES and SES. In a case where the reflective mirrors RIM1 to RIM3 are formed on the second coupling surface SES, the first reflective mirror RIM1 may be formed on the fourth sub-coupling surface S4, the second reflective mirror RIM2 may be formed on the fifth sub-coupling surface S5, and the third reflective mirror RIM3 may be formed on the sixth sub-coupling surface S6.

Angles $R\_\theta1$, $R\_\theta2$, and $R\_\theta3$ between each of the fourth sub-coupling surface S4, the fifth sub-coupling surface S5, and the sixth sub-coupling surface S6 and the second facing surface FS2 may vary depending on the inclination angles of the first and second inclination surfaces SS2 and SS3. Particularly, the angles $R\_\theta2$, and $R\_\theta3$ between the fifth and sixth sub-coupling surfaces S5 and S6 and the second facing surface FS2 may vary depending on the inclination angles of the first and second inclination surfaces SS2 and SS3.

In the present example embodiment, the structure in which the first coupling surface FES has substantially the same shape as the second coupling surface SES is shown, however, it should not be limited thereto or thereby. For example, the first coupling surface FES may have the curved shape different from the second coupling surface SES.

Figure 7A:
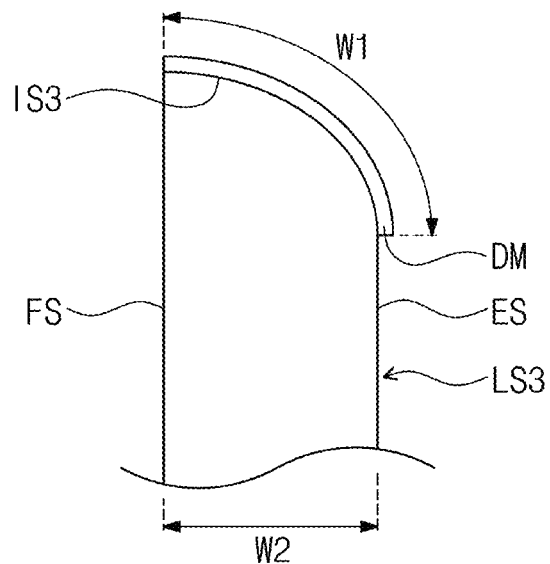
FIGS. 7A to 7D are cross-sectional views showing shapes of lenses according to some example embodiments of the present disclosure.

FIG. 7A is a cross-sectional view showing a shape of a lens LS3 according to some example embodiments of the present disclosure.

Referring to FIG. 7A, an incident surface IS3 of the lens LS3 according to some example embodiments of the present disclosure may have a curved structure. The incident surface IS3 shown in FIG. 7A may have a generally curved shape while the incident surface IS shown in FIGS. 3 to 4B includes one or more inclination surfaces SS2 and SS3. That is, the incident surface IS3 may be formed by curving two surfaces, i.e., one side surface and one bottom surface, of the lens body. As the curving processing method, a wheel processing method, a laser processing method, or the like may be used.

The display module DM may be located along the shape of the incident surface IS3. Accordingly, the display module DM having a width W1 greater than a width W2 of the lens LS3 may be located on the incident surface IS3. That is, the incident surface IS3 may receive an image from a display area having the width W1 greater than the width W2 of the lens LS3. Therefore, the FOV of the augmented reality providing device may be widened without increasing a thickness of the lens LS3.

Figure 7B:
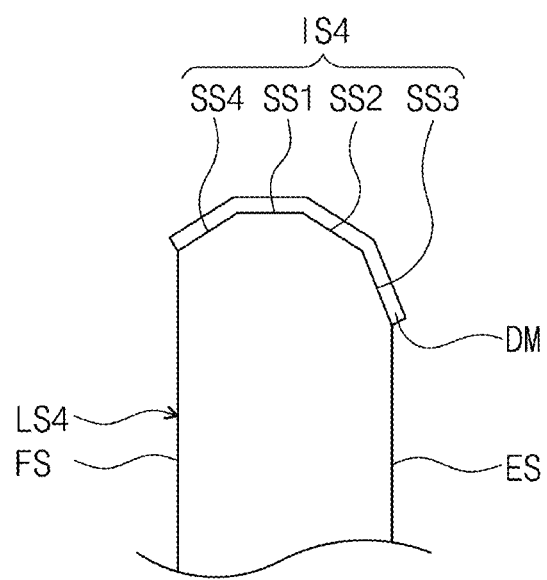
Figure 7C:
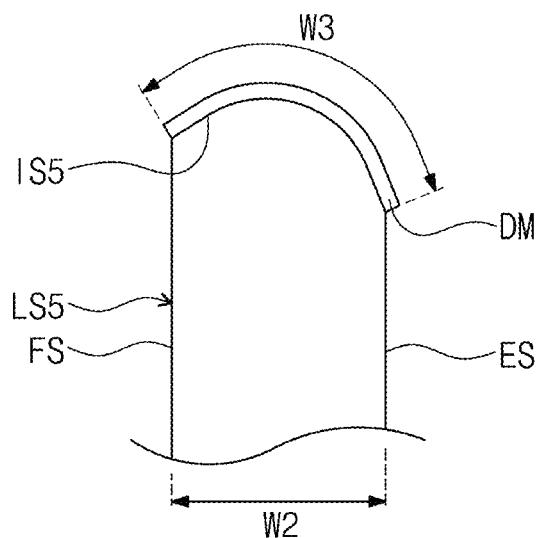

FIG. 7B is a cross-sectional view showing a shape of a lens LS4 according to some example embodiments of the present disclosure, and FIG. 7C is a cross-sectional view showing a shape of a lens LS5 according to some example embodiments of the present disclosure.

Referring to FIG. 7B, an incident surface IS4 of the lens LS4 according to some example embodiments of the present disclosure may include three inclination surfaces SS2, SS3, and SS4. That is, the incident surface IS4 may include a reference surface SS1 and first to third inclination surfaces SS2 to SS4. The first and second inclination surfaces SS2 and SS3 may be located between the reference surface SS1 and the exiting surface ES, and the third inclination surface SS4 may be located between the reference surface SS1 and the facing surface FS. The third inclination surface SS4 may be inclined at a predetermined angle with respect to the reference surface SS1, and the third inclination surface SS4 may be inclined at an angle equal to or smaller than the inclined angle of the first inclination surface SS2 with respect to the reference surface SS1.

According to some example embodiments, when the third inclination surface SS4 is located on the incident surface IS4, each of the reflective modules RM1 to RM4 (refer to FIG. 3) may further include a reflective mirror corresponding to the third inclination surface SS4. An angle of the reflective mirror corresponding to the third inclination surface SS4 may be set to allow the image incident through the third inclination surface SS4 to be provided to the user's eye HE (refer to FIG. 3).

Referring to FIG. 7C, an incident surface IS5 of the lens LS5 according to some example embodiments of the present disclosure may have a curved shape. Different from the incident surface IS3 shown in FIG. 7A, the incident surface IS5 shown in FIG. 7C may be formed by curving three surfaces, i.e., one side surface and two bottom surfaces, of the lens body. As the curving processing method, a wheel processing method, a laser processing method, or the like may be used. Accordingly, a portion of the facing surface FS of the lens LS3 of FIG. 7A may be included in the incident surface IS5. Thus, the incident surface IS5 may have a width greater than that of the incident surface IS3 of FIG. 7A.

The display module DM may be located along the shape of the incident surface IS5. Accordingly, the display module DM having a width W3 greater than a width W2 of the lens LS5 may be located on the incident surface IS5. That is, the incident surface IS5 may receive an image from a display area having the width W3 greater than the width W2 of the lens LS5. Therefore, the FOV of the augmented reality providing device may be widened without increasing a thickness of the lens LS5.

Figure 7D:
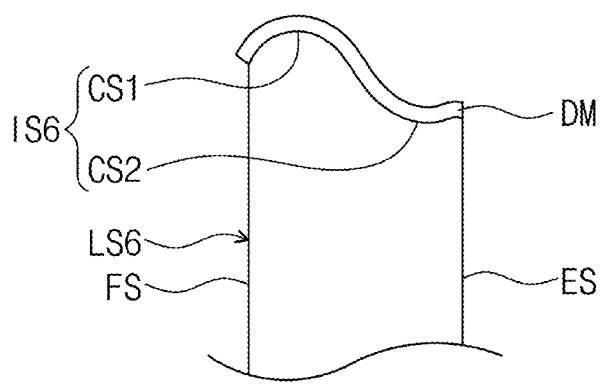

FIG. 7D is a cross-sectional view showing a shape of a lens LS6 according to some example embodiments of the present disclosure.

Referring to FIG. 7D, an incident surface IS6 of the lens LS6 according to some example embodiments of the present disclosure may include one or more curved surfaces CS1 and CS2. As an example, the incident surface IS6 includes a first curved surface CS1 and a second curved surface CS2.

The first curved surface CS1 may have a convex curved shape and, one side portion thereof may be connected to the facing surface FS. The second curved surface CS2 may be recessed inward of the lens LS6 to have a concave curved shape, one side portion thereof may be connected to the first curved surface CS1, and the other side portion thereof may be connected to the exiting surface ES.

FIG. 7D shows the structure in which two curved surfaces CS1 and CS2 are located between the facing surface FS and the exiting surface ES as a representative example, however, it should not be limited thereto or thereby. That is, three or more curved surfaces may be located between the facing surface FS and the exiting surface ES.

Figure 8:
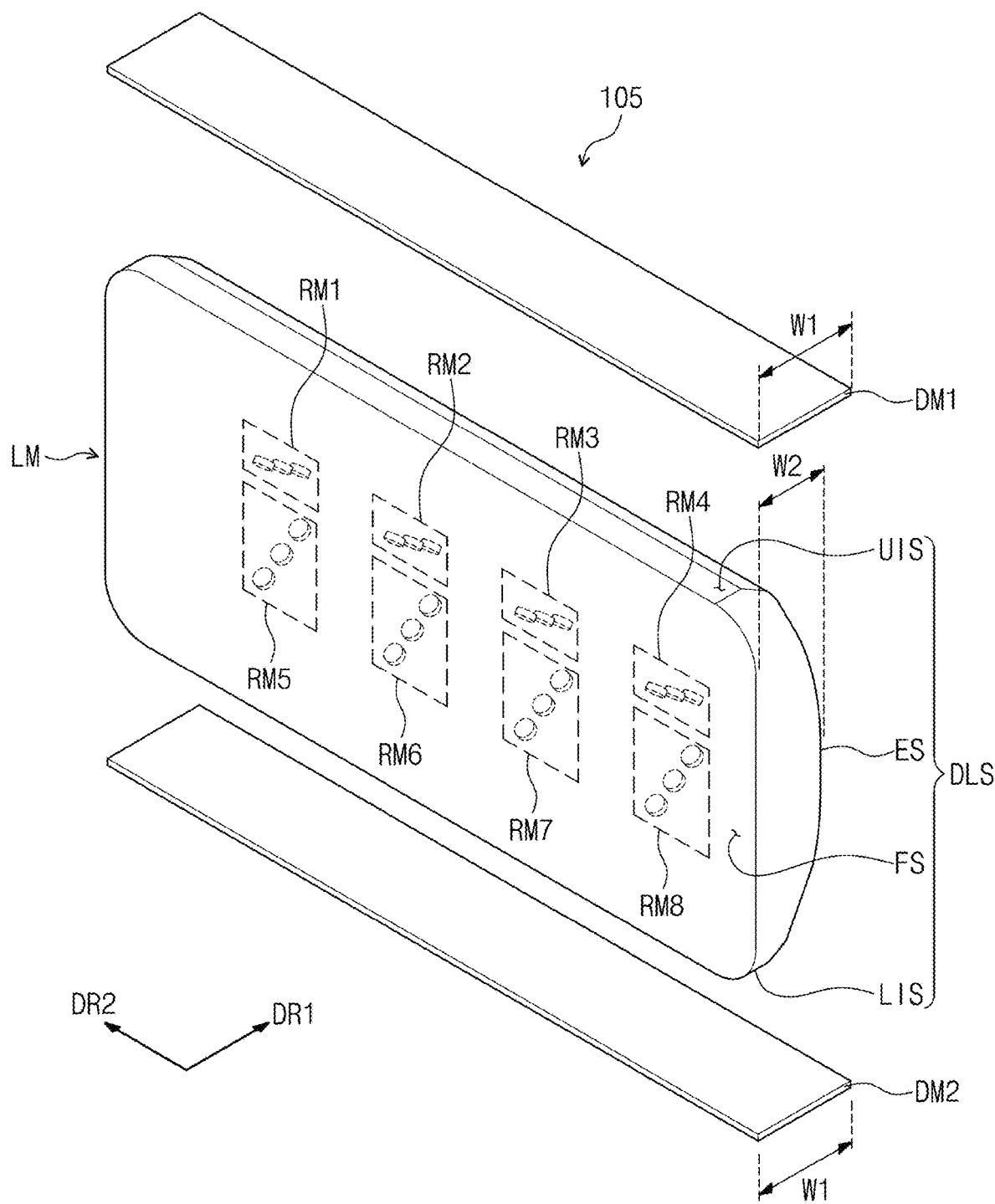
FIG. 8 is an exploded perspective view showing an augmented reality providing device according to some example embodiments of the present disclosure.
Figure 9:
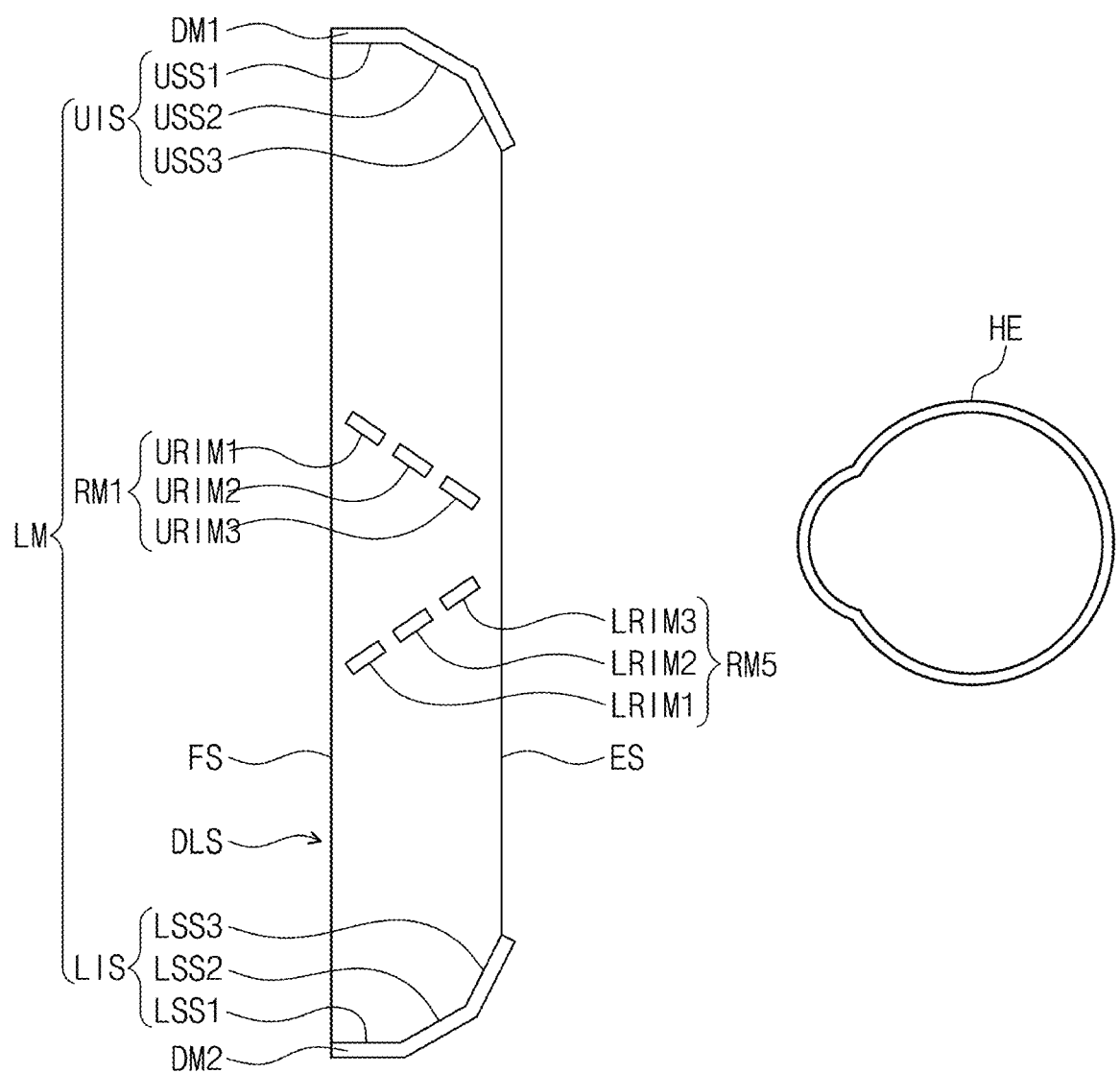
FIG. 9 is a cross-sectional view showing an operation of the augmented reality providing device shown in FIG. 8.

FIG. 8 is an exploded perspective view showing an augmented reality providing device 105 according to some example embodiments of the present disclosure, and FIG. 9 is a cross-sectional view showing an operation of the augmented reality providing device 105 shown in FIG. 8.

Referring to FIGS. 8 and 9, the augmented reality providing device 105 according to some example embodiments of the present disclosure includes a lens module LM, a first display module DM1, and a second display module DM2.

The lens module LM includes a lens DLS, a plurality of upper reflective modules RM1 to RM4, and a plurality of lower reflective modules RM5 to RM8. The lens DLS may be formed of a glass or plastic material to be transparent or semi-transparent.

The lens DLS may have a decahedron shape defined by two bottom surfaces ES and FS facing each other and side surfaces connecting the two bottom surfaces ES and FS. At least two side surfaces among the side surfaces of the lens DLS may have a multi-sided structure. One side surface of the at least two side surfaces having the multi-sided structure may be located adjacent to the first display module DM1 and may receive an image from the first display module DM1. The other side surface of the at least two side surfaces having the multi-sided structure may be located adjacent to the second display module DM2 and may receive an image from the second display module DM2. Accordingly, hereinafter, the side surface located adjacent to the first display module DM1 will be referred to a "first incident surface UIS", and the side surface located adjacent to the second display module DM2 will be referred to a "second incident surface LIS". That is, each of the first and second incident surfaces UIS and LIS may have the multi-sided structure. The first incident surface UIS may include a plurality of surfaces arranged in the first direction DR1 and may extend in the second direction DR2 perpendicular to the first direction DR1. The second incident surface LIS may include a plurality of surfaces arranged in the first direction DR1 and may extend in the second direction DR2 to be parallel to the first incident surface UIS.

The first display module DM1 displays a virtual image to implement the augmented reality. The first display module DM1 is located adjacent to the first incident surface UIS of the lens DLS, and the image displayed through the first display module DM1 is provided to the lens module LM through the first incident surface UIS. The second display module DM2 displays a virtual image to implement the augmented reality. The second display module DM2 is located adjacent to the second incident surface LIS of the lens DLS, and the image displayed through the second display module DM2 is provided to the lens module LM through the second incident surface LIS.

The upper reflective modules RM1 to RM4 may be arranged in the second direction DR2 along the first incident surface UIS, and the lower reflective modules RM5 to RM8 may be arranged in the second direction DR2 along the second incident surface LIS. FIG. 8 shows the structure in which the lens module LM includes four upper reflective modules RM1 to RM4 and four lower reflective modules RM5 to RM8, however, the number of the reflective modules RM1 to RM8 should not be limited thereto or thereby.

Each of the upper reflective modules RM1 to RM4 includes a plurality of upper reflective mirrors URIM1 to URIM3, and each of the lower reflective modules RM5 to RM8 includes a plurality of lower reflective mirrors LRIM1 to LRIM3. The upper reflective mirrors URIM1 to URIM3 are arranged in the first direction DR1. The upper reflective mirrors URIM1 to URIM3 are arranged to become closer to the second incident surface LIS as going in the first direction DR1. The lower reflective mirrors LRIM1 to LRIM3 are arranged in the first direction DR1. The lower reflective mirrors LRIM1 to LRIM3 are arranged to become closer to the first incident surface UIS as going in the first direction DR1.

As an example, each of the reflective modules RM1 to RM8 includes three reflective mirrors, however, the number of the reflective mirrors should not be limited thereto or thereby.

The upper reflective mirrors URIM1 to URIM3 are located to reflect a virtual image displayed through the first display module DM1 and to allow the virtual image to be focused at one point on the retina of the user's eye HE. The lower reflective mirrors LRIM1 to LRIM3 are located to reflect a virtual image displayed through the second display module DM2 and to allow the virtual image to be focused at one point on the retina of the user's eye HE.

As described above, in the case where the user receives the virtual image from two display modules DM1 and DM2, the FOV of the augmented reality providing device 105 may be widened.

Referring to FIG. 9, the first incident surface UIS may include at least one inclination surface. As an example, the first incident surface UIS may include an upper reference surface USS1, a first upper inclination surface USS2, and a second upper inclination surface USS2.

The upper reference surface USS1 may be a surface substantially perpendicular to the exiting surface ES and the facing surface FS. One side portion of the upper reference surface USS1 may be connected to the facing surface FS. The first upper inclination surface USS2 may be inclined with respect to the upper reference surface USS1, and one side portion of the first upper inclination surface USS2 may be connected to the upper reference surface USS1. The second upper inclination surface USS3 may be inclined with respect to the upper reference surface USS1, one side portion of the second upper inclination surface USS3 may be connected to the first upper inclination surface USS2, and the other side portion of the second upper inclination surface USS3 may be connected to the exiting surface ES. The first and second upper inclination surfaces USS2 and USS3 may be located between the exiting surface ES and the upper reference surface USS1.

The second incident surface LIS may be located at an opposite side to the first incident surface UIS and may include at least one inclination surface. As an example, the second incident surface LIS may include a lower reference surface LSS1, a first lower inclination surface LSS2, and a second lower inclination surface LSS3.

The lower reference surface LSS1 may be a surface substantially perpendicular to the exiting surface ES and the facing surface FS. One side portion of the lower reference surface LSS1 may be connected to the facing surface FS. The first lower inclination surface LSS2 may be inclined with respect to the lower reference surface LSS1, and one side portion of the first lower inclination surface LSS2 may be connected to the lower reference surface LSS1. The second lower inclination surface LSS3 may be inclined with respect to the lower reference surface LSS1, one side portion of the second lower inclination surface LSS3 may be connected to the first lower inclination surface LSS2, and the other side portion of the second lower inclination surface LSS3 may be connected to the exiting surface ES. The first and second lower inclination surfaces LSS2 and LSS3 may be located between the exiting surface ES and the lower reference surface LSS1.

In FIGS. 8 and 9, the structure of each of the first and second incident surfaces UIS and LIS should not be limited thereto or thereby. That is, each of the first and second incident surfaces UIS and LIS may have the shapes of the incident surfaces shown in FIGS. 7A to 7D. In addition, the first and second incident surfaces UIS and LIS have substantially the same shape as each other in the present example embodiment, however, they should not be limited thereto or thereby. That is, the first and second incident surfaces UIS and LIS may have different shapes from each other.

Since the shape of the first and second incident surfaces UIS and LIS is the same as the shape of the incident surface IS shown in FIG. 3, detailed descriptions of the first and second incident surfaces UIS and LIS will be omitted.

A width W1 in the first direction DR1 of the first and second display modules DM1 and DM2 may be greater than a width W2 in the first direction DR1 of the lens DLS. That is, when the first and second display modules DM1 and DM2 are unfolded in the first direction DR1 before the first and second display modules DM1 and DM2 are coupled to the lens DLS, the width W1 of the first and second display modules DM1 and DM2 is greater than the width W2 of the lens DLS.

The first and second display modules DM1 and DM2 may have a flexibility and thus may be bent. For example, each of the first and second display modules DM1 and DM2 may be a flexible organic light emitting display device.

As shown in FIG. 9, when the first and second display modules DM1 and DM2 are coupled to the lens DLS, the first display module DM1 is bent along the first incident surface UIS, and the second display module DM2 is bent along the second incident surface LIS. That is, the first and second display modules DM1 and DM2 may be located corresponding to the shape of the first and second incident surfaces UIS and LIS. Accordingly, the first and second display modules DM1 and DM2 having the width W1 greater than the width W2 of the lens DLS may be respectively located on the first and second incident surfaces UIS and LIS. Thus, the FOV of the augmented reality providing device 105 may be widened without increasing a thickness of the lens DLS.

Figure 10:
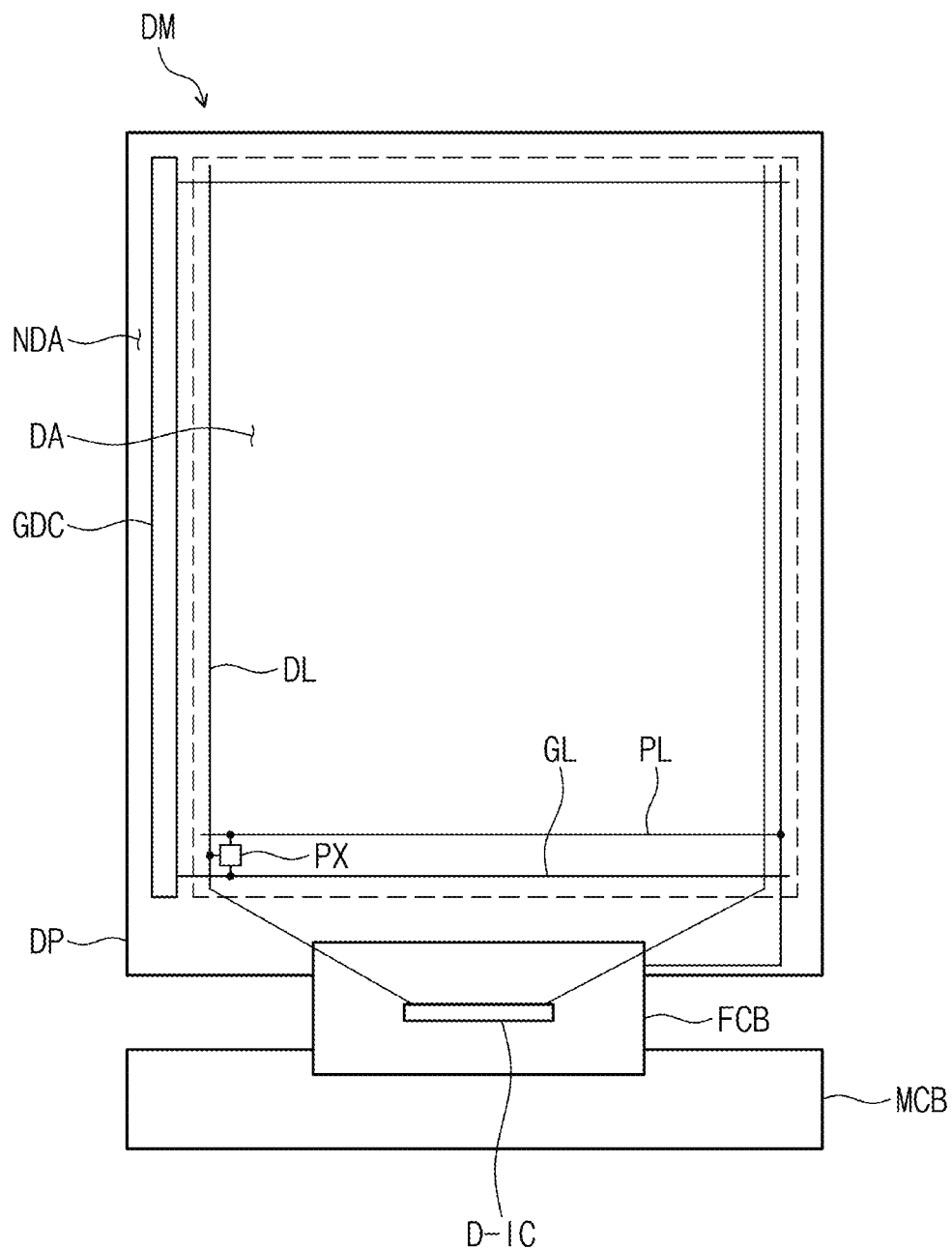
FIG. 10 is a plan view showing a display panel according to some example embodiments of the present disclosure.
Figure 11:
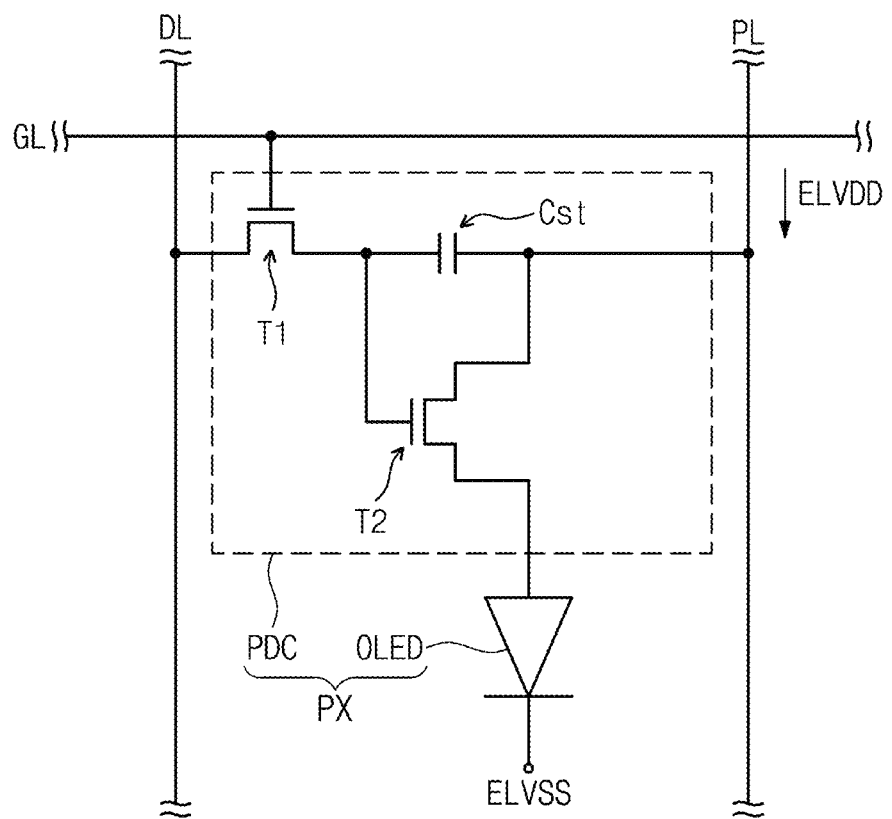
FIG. 11 is a circuit diagram showing a pixel shown in FIG. 10.
Figure 12:
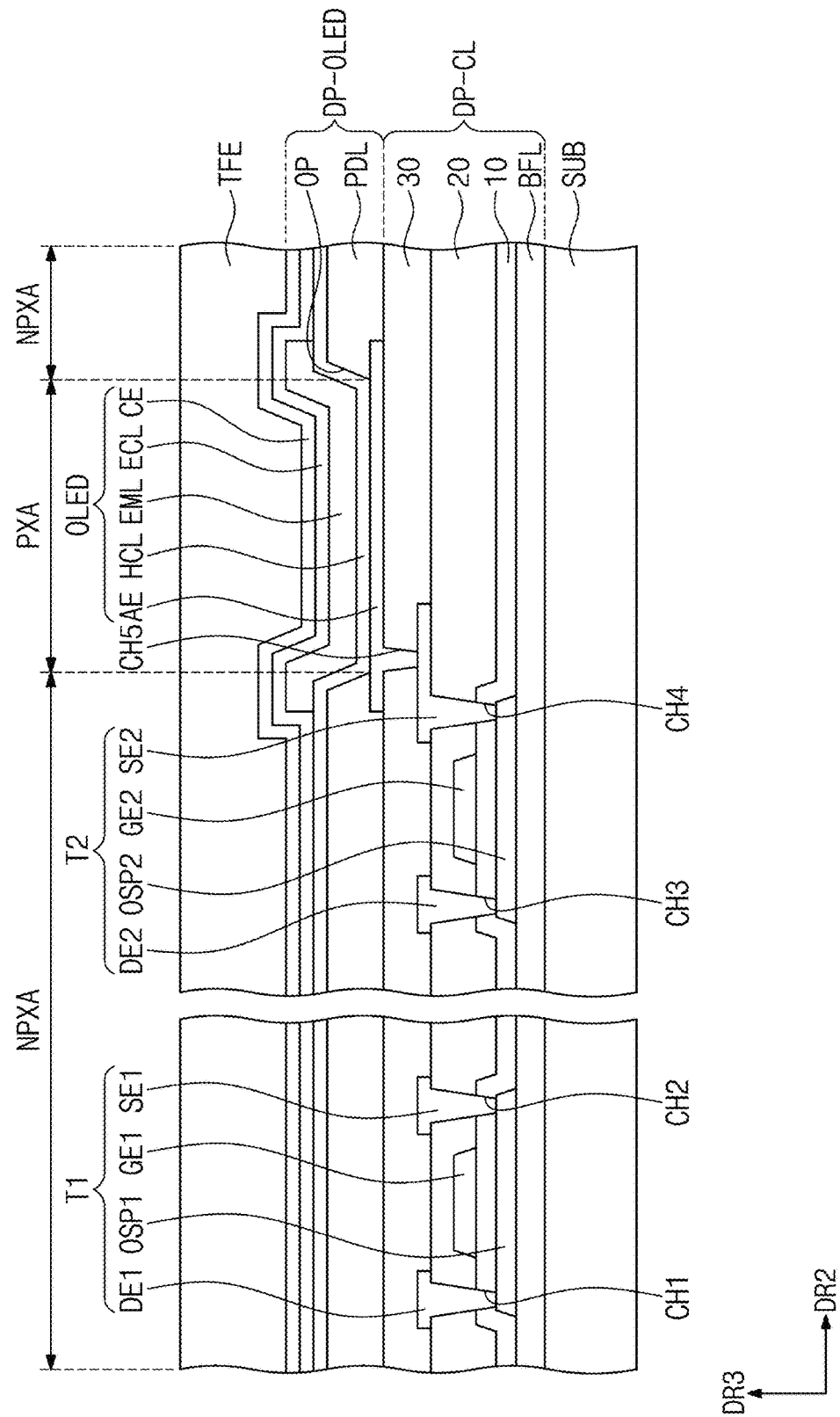
FIG. 12 is a cross-sectional view showing a display panel according to some example embodiments of the present disclosure.

FIG. 10 is a plan view showing a display panel according to some example embodiments of the present disclosure, FIG. 11 is a circuit diagram showing a pixel shown in FIG. 10, and FIG. 12 is a cross-sectional view showing a display panel according to some example embodiments of the present disclosure.

Referring to FIGS. 10 to 12, a display module DM may include a display panel DP. The display panel DP may include a display area DA and a non-display area NDA when viewed in a plan view. In the present example embodiment, the non-display area NDA is defined along an edge of the display area DA.

The display panel DP includes a driving circuit GDC, a plurality of signal lines GL, DL, and PL and a plurality of pixels PX. The pixels PX are arranged in the display area DA. Each of the pixels PX includes an organic light emitting diode OLED and a pixel driving circuit PDC connected to the organic light emitting diode OLED. The driving circuit GDC, the signal lines GL, DL, and PL, and the pixel driving circuit PDC may be included in a circuit element layer DP-CL shown in FIG. 12.

The driving circuit GDC includes a shift register. The shift register includes a plurality of stages, each of which generates a plurality of scan signals, and sequentially outputs the scan signals to a plurality of scan lines GL described later. As another example, the driving circuit GDC may further output another control signal to the pixel driving circuit PDC.

The driving circuit GDC may include a plurality of thin film transistors formed through the same process as the pixel driving circuit PDC, e.g., a low temperature polycrystalline silicon (LTPS) process or a low temperature polycrystalline oxide (LTPO) process.

The signal lines GL, DL, and PL include the scan lines GL, data lines DL, and a power line PL. Each of the scan lines GL is connected to a corresponding pixel PX among the pixels PX, and each of the data lines DL is connected to a corresponding pixel PX among the pixels PX. The power line PL is connected to the pixels PX.

The display module DM includes a circuit board FCB connected to the display panel DP and a driving chip D-IC mounted on the circuit board FCB. The circuit board FCB may be a flexible printed circuit board. The display module DM further includes a main circuit board MCB, and the main circuit board MCB connects to the display panel DP through the circuit board FCB.

In the present example embodiment, a chip-on-film (COF) structure in which the driving chip D-IC is mounted on the circuit board FCB is shown, however, it should not be limited thereto or thereby. For example, the display module DM may have a chip-on-panel (COP) structure in which the driving chip D-IC is mounted on the display panel DP.

FIG. 11 shows the pixel PX connected to one scan line GL, one data line DL, and the power line PL as a representative example. A configuration of the pixel PX may be changed without being limited thereto or thereby.

The organic light emitting diode OLED may be a front surface light emitting type diode or a rear surface light emitting type diode. The pixel PX includes a first transistor T1 (or a "switching transistor"), a second transistor T2 (or a "driving transistor"), and a capacitor Cst as the pixel driving circuit PDC to drive the organic light emitting diode OLED. A first power voltage ELVDD is applied to the second transistor T2, and a second power voltage ELVSS is applied to the organic light emitting diode OLED. The second power voltage ELVSS may be lower than the first power voltage ELVDD.

The first transistor T1 outputs a data signal applied thereto through the data line DL in response to the scan signal applied thereto through the scan line GL. The capacitor Cst is charged with a voltage corresponding to the data signal provided from the first transistor T1.

The second transistor T2 is connected to the organic light emitting diode OLED. The second transistor T2 controls a driving current flowing through the organic light emitting diode OLED in response to an amount of electric charge charged in the capacitor Cst. The organic light emitting diode OLED emits a light during a turned-on period of the second transistor T2.

FIG. 11 shows a structure in which the pixel driving circuit PDC includes two transistors T1 and T2 and one capacitor Cst, however, the configuration of the pixel driving circuit PDC should not be limited thereto or thereby.

As shown in FIG. 12, in the display panel DP according to some example embodiments of the present disclosure, the circuit element layer DP-CL, a display element layer DP-OLED, and a thin film encapsulation layer TFE may be sequentially stacked on a base layer SUB.

The circuit element layer DP-CL includes at least one inorganic layer, at least one organic layer, and a circuit element. The circuit element layer DP-CL includes a buffer layer BFL that is the inorganic layer, a first intermediate inorganic layer 10, a second intermediate inorganic layer 20, and an intermediate organic layer 30 that is the organic layer.

The inorganic layers may include silicon nitride, silicon oxynitride, and silicon oxide. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin. The circuit element includes conductive patterns and/or semiconductor patterns.

The buffer layer BFL improves a coupling force between the base layer SUB and the conductive patterns or the semiconductor patterns. According to some example embodiments, a barrier layer may be further located on an upper surface of the base layer SUB to prevent foreign substances from entering. The buffer layer BFL and the barrier layer may be selectively located or omitted.

A semiconductor pattern OSP1 (hereinafter, referred to as a "first semiconductor pattern") of the first transistor T1 and a semiconductor pattern OSP2 (hereinafter, referred to as a "second semiconductor pattern") of the second transistor T2 are located on the buffer layer BFL. The first semiconductor pattern OSP1 and the second semiconductor pattern OSP2 may be selected from amorphous silicon, polycrystalline silicon, and metal oxide semiconductor.

The first intermediate inorganic layer 10 is located on the first semiconductor pattern OSP1 and the second semiconductor pattern OSP2. A control electrode GE1 (hereinafter, referred to as a "first control electrode") of the first transistor T1 and a control electrode GE2 (hereinafter, referred to as a "second control electrode") of the second transistor T2 are located on the first intermediate inorganic layer 10. The first control electrode GE1 and the second control electrode GE2 may be formed through the same photolithography process as the scan lines GL (refer to FIGS. 10 and 11).

The second intermediate inorganic layer 20 is located on the first intermediate inorganic layer 10 to cover the first control electrode GE1 and the second control electrode GE2. An input electrode DE1 (hereinafter, referred to as a "first input electrode") and an output electrode SE1 (hereinafter, referred to as a "first output electrode") of the first transistor T1 and an input electrode DE2 (hereinafter, referred to as a "second input electrode") and an output electrode SE2 (hereinafter, referred to as a "second output electrode") of the second transistor T2 are located on the second intermediate inorganic layer 20.

The first input electrode DE1 and the first output electrode SE1 are connected to the first semiconductor pattern OSP1 respectively through a first contact hole CH1 and a second contact hole CH2, which are defined through the first intermediate inorganic layer 10 and the second intermediate inorganic layer 20. The second input electrode DE2 and the second output electrode SE2 are connected to the second semiconductor pattern OSP2 respectively through a third contact hole CH3 and a fourth contact hole CH4, which are defined through the first intermediate inorganic layer 10 and the second intermediate inorganic layer 20. Meanwhile, according to another embodiment of the present disclosure, a portion of the first transistor T1 and the second transistor T2 may be changed to a bottom gate structure.

The intermediate organic layer 30 is located on the second intermediate inorganic layer 20 to cover the first input electrode DE1, the second input electrode DE2, the first output electrode SE1, and the second output electrode SE2. The intermediate organic layer 30 may provide a flat surface.

The display element layer DP-OLED is located on the intermediate organic layer 30. The display element layer DP-OLED includes a pixel definition layer PDL and the organic light emitting diode OLED. The pixel definition layer PDL includes an organic material as the intermediate organic layer 30. A first electrode AE is located on the intermediate organic layer 30. The first electrode AE is connected to the second output electrode SE2 through a fifth contact hole CH5 defined through the intermediate organic layer 30. An opening OP is defined through the pixel definition layer PDL. At least a portion of the first electrode AE is exposed through the opening OP of the pixel definition layer PDL.

The pixel PX is located in a pixel area when viewed in a plan view. The pixel area includes a light emitting area PXA and a non-light emitting area NPXA located adjacent to the light emitting area PXA. The non-light emitting area NPXA surrounds the light emitting area PXA. In the present example embodiment, the light emitting area PXA is defined to correspond to a portion of the first electrode AE exposed through the opening OP.

A hole control layer HCL may be commonly located over the light emitting area PXA and the non-light emitting area NPXA. According to some example embodiments, a common layer like the hole control layer HCL may be commonly formed over the plural pixels PX.

A light emitting layer EML may be located on the hole control layer HCL. The light emitting layer EML may be located in an area corresponding to the opening OP. That is, the light emitting layer EML may be formed in each of the pixels PX after being divided into plural portions. The light emitting layer EML may include an organic material and/or an inorganic material. In the present example embodiment, the patterned light emitting layer EML is shown as a representative example, however according to another embodiment, the light emitting layer EML may be commonly located over the pixels PX. In this case, the light emitting layer EML may emit a white light. In addition, the light emitting layer EML may have a multi-layer structure.

An electron control layer ECL is located on the light emitting layer EML. According to some example embodiments, the electron control layer ECL may be commonly formed over the pixels PX.

A second electrode CE is located on the electron control layer ECL. The second electrode CE is commonly located over the pixels PX.

The thin film encapsulation layer TFE is located on the second electrode CE. The thin film encapsulation layer TFE is commonly located over the pixels PX. In the present example embodiment, the thin film encapsulation layer TFE directly covers the second electrode CE. According to some example embodiments of the present disclosure, a capping layer may be further located between the thin film encapsulation layer TFE and the second electrode CE to cover the second electrode CE. In this case, the thin film encapsulation layer TFE may directly cover the capping layer.

FIG. 12 shows an example of the display panel DP, and the display panel DP of the present disclosure should not be limited to the structure of FIG. 12.

Although aspects of some example embodiments of the present disclosure have been described, it is understood that the present disclosure should not be limited to these example embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims and their equivalents.

What is claimed is:

1. A display device comprising:
   a lens module comprising a lens and a reflective module comprising a plurality of reflective mirrors in the lens; and
   a display module on at least one side surface of the lens, the display module being configured to display an image and comprising a light emitting element, the lens comprising:
      a side surface facing the display module and configured to receive the image; and
      an exiting surface configured to emit the image reflected by the reflective module,
   wherein the side surface comprises one or more inclination surfaces,
   wherein the side surface comprises:
      a reference surface; and
      a first inclination surface inclined at a first angle with respect to the reference surface,
   wherein a shape of the display module follows a contour of the reference surface and the first inclination surface,
   the display module comprises a first display area corresponding to the reference surface and a second display area corresponding to the first inclination surface,
   the plurality of reflective mirrors comprise:
      a first reflective mirror configured to reflect a first image output from the first display area and incident thereto through the reference surface to the exiting surface; and
      a second reflective mirror configured to reflect a second image output from the second display area and incident thereto through the first inclination surface to the exiting surface, wherein the first reflective mirror is configured to reflect the first image to the exiting surface without the first image being internally reflected by the lens before being incident on the first reflective mirror, and the second reflective mirror is configured to reflect the second image to the exiting surface with the second image being internally reflected by the lens before being incident on the second reflective mirror,
   the first reflective mirror and the second reflective mirror are inclined at different angles from each other with respect to a facing surface facing the exiting surface,
   an angle of the second reflective mirror is set depending on the first angle.

2. The display device of claim 1, wherein the first inclination surface is between the reference surface and the exiting surface.

3. The display device of claim 1, wherein the reference surface and the first inclination surface have a surface roughness equal to or smaller than about 10 nm.

4. The display device of claim 1, wherein the side surface further comprises a second inclination surface inclined at a second angle with respect to the reference surface.

5. The display device of claim 4, wherein the first and second inclination surfaces are between the reference surface and the exiting surface, and the second angle is greater than the first angle.

6. The display device of claim 5, wherein the display module further comprises a third display area corresponding to the second inclination surface,
   the reflective mirrors further comprise:
      a third reflective mirror configured to reflect a third image output from the third display area and incident thereto through the second inclination surface to the exiting surface.

7. The display device of claim 6, wherein the first, second, and third reflective mirrors are inclined at different angles from each other.

8. The display device of claim 4, wherein the reference surface, the first inclination surface, and the second inclination surface have a surface roughness equal to or smaller than about 10 nm.

9. The display device of claim 1, wherein the reference surface is substantially perpendicular to the exiting surface.

10. The display device of claim 1, wherein the lens comprises:
a first lens; and
a second lens coupled to the first lens, and the reflective module is between the first lens and the second lens.

11. The display device of claim 10, wherein the first lens comprises a first coupling surface to be coupled to the second lens, the second lens comprises a second coupling surface facing the first coupling surface, and the reflective module is on one of the first and second coupling surfaces.

12. The display device of claim 11, wherein the lens further comprises an adhesive layer between the first coupling surface and the second coupling surface to couple the first and second lenses.

13. The display device of claim 11, wherein each of the first and second coupling surfaces has a curved shape.

14. The display device of claim 11, wherein each of the first and second coupling surfaces comprises a plurality of inclination surfaces, and the inclination surfaces have different inclination angles from each other.

15. The display device of claim 1, wherein the display module comprises an organic light emitting display device.

16. The display device of claim 1, wherein the display module comprises a flexible display module.

\* \* \* \* \*